(12) United States Patent
Keh et al.

(10) Patent No.: US 7,056,036 B2
(45) Date of Patent: Jun. 6, 2006

(54) HIGH SPEED TO-CAN BASED OPTICAL MODULE

(75) Inventors: Yong-Chan Keh, Suwon-shi (KR); Mun-Kue Park, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 176 days.

(21) Appl. No.: 10/625,160

(22) Filed: Jul. 23, 2003

(65) Prior Publication Data

US 2004/0126066 A1     Jul. 1, 2004

(30) Foreign Application Priority Data

Dec. 27, 2002 (KR) ...................... 10-2002-0085022

(51) Int. Cl.
*G02B 6/42* (2006.01)
*H01S 3/00* (2006.01)

(52) U.S. Cl. .................... 385/92; 372/33; 372/38.1; 385/88

(58) Field of Classification Search ............ 257/80–82, 257/704, 708, 712, 717–719; 372/29.01, 372/29.011, 38.01, 38.1; 385/88, 92
See application file for complete search history.

(56) References Cited

U.S. PATENT DOCUMENTS

| 3,959,765 | A | * | 5/1976 | Stewart | 338/34 |
| 4,686,678 | A | * | 8/1987 | Ohta et al. | 372/703 |
| 5,694,048 | A | * | 12/1997 | Boudreau et al. | 324/752 |
| 6,404,317 | B1 | * | 6/2002 | Mizoguchi et al. | 336/200 |
| 6,733,190 | B1 | * | 5/2004 | Kuhara et al. | 385/92 |

FOREIGN PATENT DOCUMENTS

JP     3217065 A   *   9/1991

\* cited by examiner

*Primary Examiner*—Sung Pak
*Assistant Examiner*—Omar Rojas
(74) *Attorney, Agent, or Firm*—Cha & Reiter, L.L.C.

(57) ABSTRACT

An optical module having a TO-can structure is disclosed, wherein frequency characteristics have been improved in order to make high-speed transmission possible. The optical module comprising a silicon optical bench wherein a V-groove is formed, a laser diode disposed on the V-groove of the silicon optical bench, which emits light, a photo diode which receives the light and converts it into current, a stem wherein the silicon bench and the photo diode have been disposed, and a plurality of leads coupled to the stem, to provide electric signals with the laser diode and the photo diode.

19 Claims, 5 Drawing Sheets

HIGH SPEED TO-CAN BASED OPTICAL MODULE

CLAIM OF PRIORITY

This application claims priority to an application entitled "Optical module," filed with the Korean Intellectual Property Office on Dec. 27, 2002 and assigned Serial No. 2002-85022, the contents of which are hereby incorporated by reference.

BACKGROUND OF THE INVENTION

1. Field of the Invention

The present invention relates to an optical module, and more particularly to an optical module having a TO-can structure, in which frequency characteristics have been improved in order to achieve high speed transmission.

2. Description of the Related Art

As is generally known in the art, an optical module is an indispensable component for optical communication. The requirements for high speed transmission for the optical module are increased along with the increase of the data transmission volume. Also, it is required to secure an optical broad bandwidth for the frequency adaptable to high speed transmission. At present, a TO-can structure is widely employed as a package for optical devices such as a laser diode and a photo diode in the optical module.

FIG. 1 shows a conventional 10 Gbps TO-can laser module. Such a 10 Gbps TO-can laser module was recently produced by Demeter Technologies Inc. FIG. 2 shows another conventional 10 Gbps TO-can laser module developed by IT Component Division of Sumitomo Electric Industries, Ltd.

Referring to FIG. 1 and FIG. 2, the conventional optical module having a TO-can structure comprises a stem 40 on which a sub-mount 20 is mounted, a laser diode 10 bonded on the sub-mount, a photo diode 30 mounted on the stem 40, a plurality of leads 50 disposed through the stem 40 and electrically connected with the laser diode 10 and the photo diode 30. The sub-mount 20 may be formed from materials such as AIN, SiC, etc., and the stem 40 may be made from materials such as CuW, KOVAR, iron, and etc.

However, such conventional optical modules suffer from parasitic capacitance and inductance due to the use of bonding wires (e.g. connecting the leads and the sub-mount, and connecting the laser diode and the leads). Accordingly, the RF characteristics are deteriorated, resulting in difficulty when the optical modules are used for in high-speed transmission systems covering 10 Gbps. This is because the 3 dB bandwidth is limited within 1 or 2 GHz due to the parasitic components in the package itself.

Further, such conventional optical modules employ a sub-mount designed as a waveguide structure. Therefore, the sub-mount becomes large in size so that the distance between the laser diode and the photo diode becomes longer, bringing about difficulty in achieving adequate monitor photo-current.

SUMMARY OF THE INVENTION

The present invention is to provide an optical module having both the required high-frequency characteristics and the capability of making the most effective use of a TO-can structure for high-speed transmission systems.

In one embodiment, an optical module includes: a silicon optical bench (SiOB) wherein a V-groove is formed, a laser diode disposed on the V-groove of the silicon optical bench, which emits light, a photo diode which receives the light emitted from the laser diode and converts it into current, a stem wherein the silicon bench and the photo diode have been disposed, and a plurality of leads coupled to the stem, to provide the laser diode and the photo diode with the electric signals.

Other embodiments of the invention may include (1) an inductor for the purpose of AC choking can be disposed on the silicon optical bench and connected with the laser diode. Moreover, when a spiral type thin film inductor is monolithically integrated on to the silicon optical bench, the optical module can become more compact in size, (2) a RF matching resistor can be additionally disposed on the silicon optical bench also by the thin film process and connected with the laser diode, and (3) the stem and the leads can be assembled by means of glass powder which is thermally matched and hermetically sealed with the stem material Still further, in one embodiment of the present invention, the plurality of leads comprises a first lead electrically connected with an anode of the laser diode, second and third leads electrically connected with a RF terminal and a DC terminal of the laser diode respectively, and fourth and fifth leads electrically connected with an anode and a cathode of the photo diode respectively. It is preferable that the first lead and the fifth lead are made as common leads. Also, the leads can be preferably bonded with the silicon optical bench by means of epoxy or solder.

In addition, an inductor can be further disposed between the cathode of the photo diode and the anode of the laser diode in order to achieve RF isolation.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Figure 1:
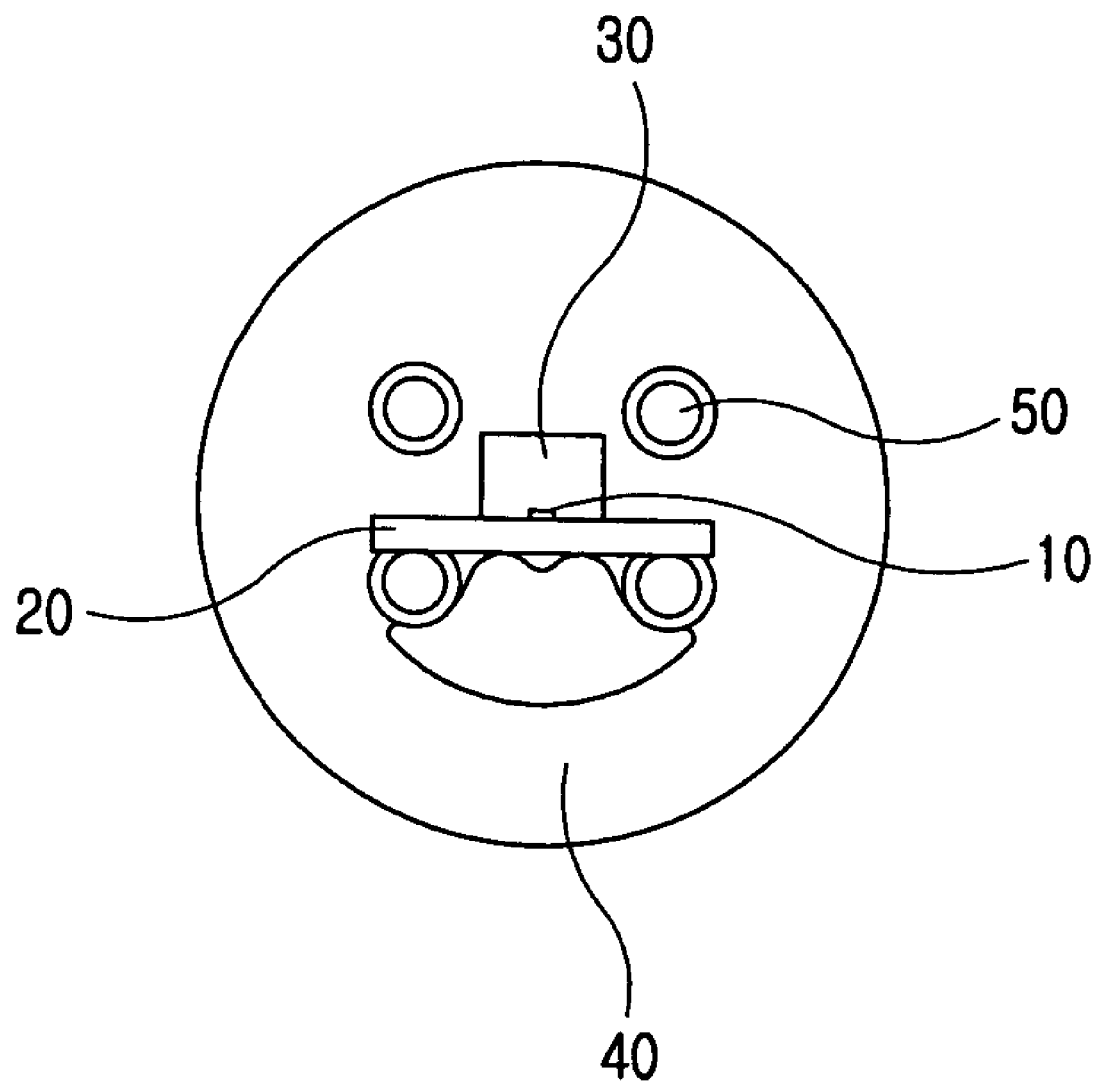
FIG. 1 shows a conventional 10 Gbps TO-can laser module.
Figure 2:
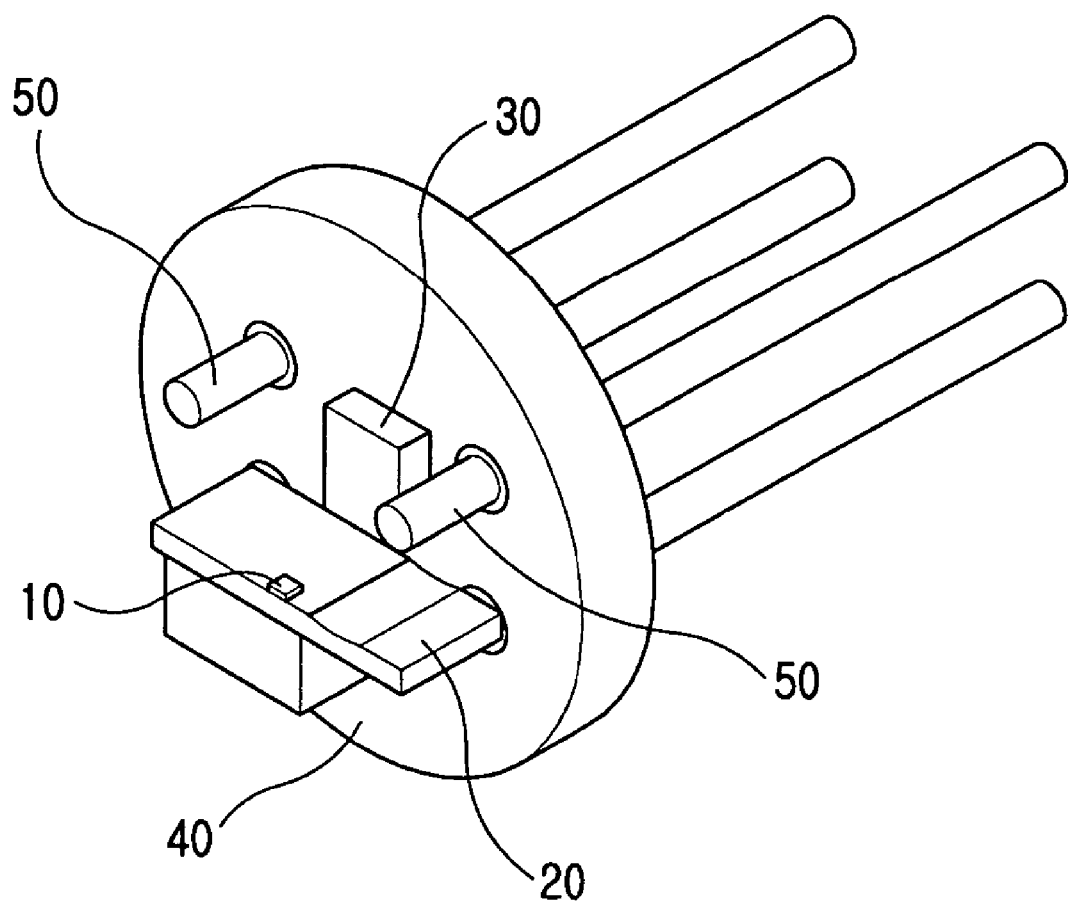
FIG. 2 shows another conventional 10 Gbps TO-can laser module.

In the following description of the present invention, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments that depart from these specific details. Moreover, it will be recognized that certain aspects of the figures are simplified for explanation purposes and that the full system environment for the invention will comprise many known functions and configurations all of which need not be shown here. In the drawings, the same or similar elements are denoted by the same reference numerals even though they are depicted in different drawings.

Figure 3:
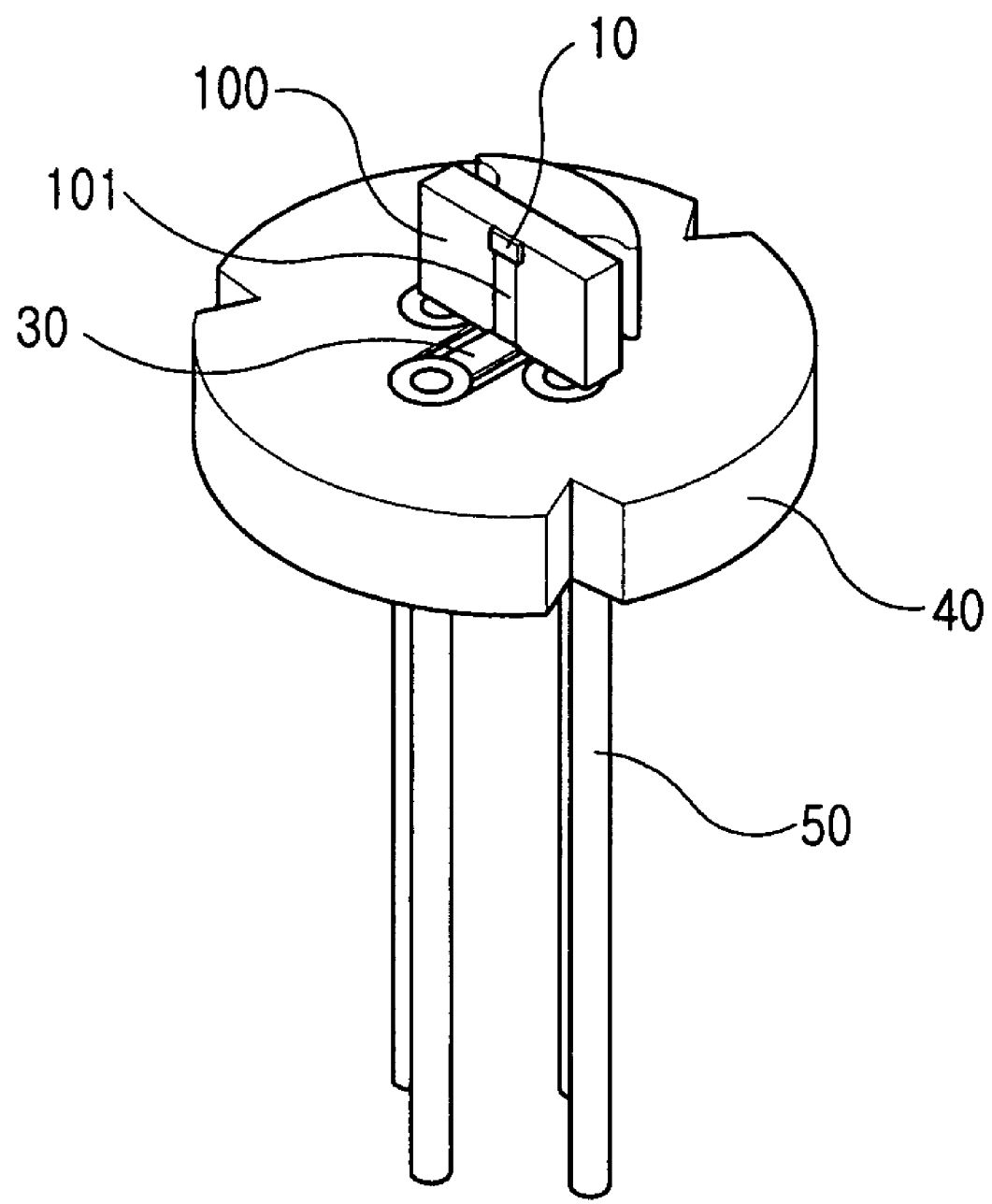
FIG. 3 is a schematic view of a TO-can laser module according to a preferred embodiment of the present invention.
Figure 4:
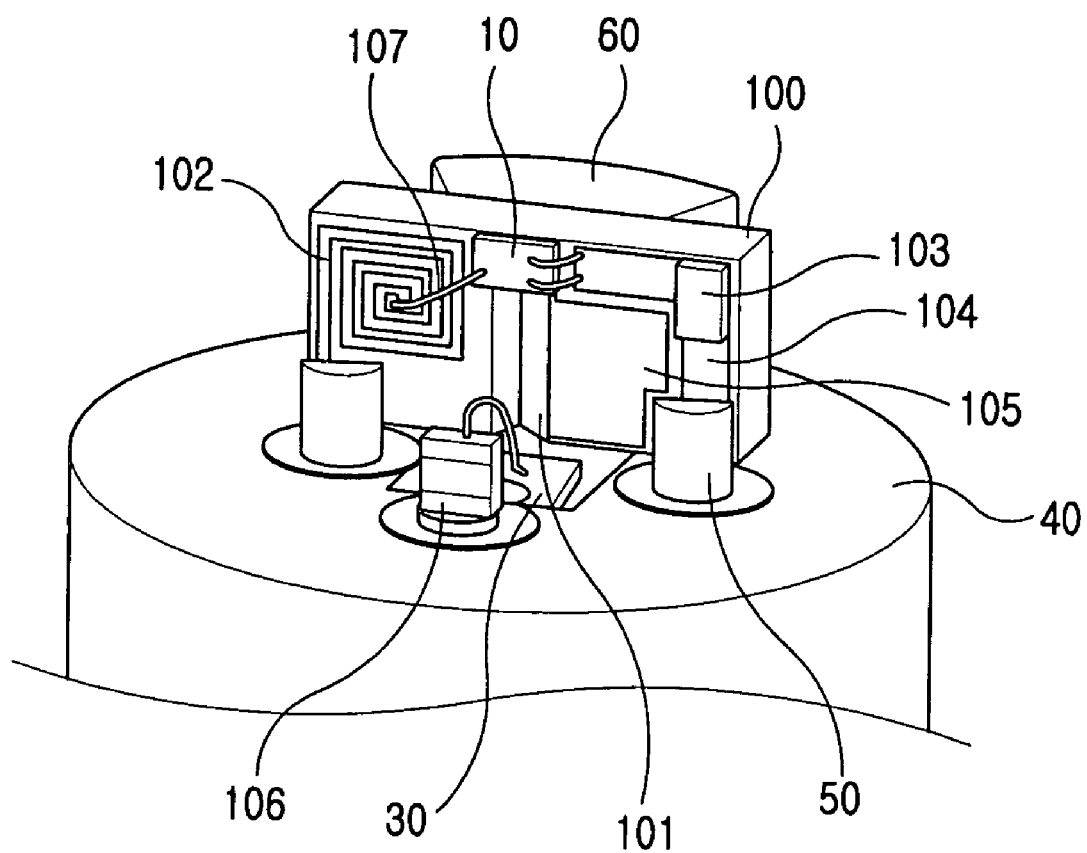
FIG. 4 is a detailed view of the TO-can laser module according to a preferred embodiment of the present invention.

FIG. 3 is a schematic view of a TO-can laser module according to a preferred embodiment of the present invention. FIG. 4 is a detailed view of the TO-can laser module according to a preferred embodiment of the present invention.

Referring now to FIGS. 3 and 4, an optical laser module having a TO-can structure comprises a laser diode 10, a photo diode 30, a stem 40, a plurality of leads 50, and a silicon optical bench (SiOB) 100. Also, the optical laser diode module of the present invention further comprises a RF matching register 103, 50 Ω characteristic impedance lines 104 and 105, and inductors 102 and 106.

SiOB 100 has a V-groove 101 formed therein employed as a sub-mount, and die-bonded on the heat sink 60 which is vertical to the flat TO stem 40. SiOB 100 and lead 50 have been electrically connected. By mentioning "electrically connected", we mean fixing them with a conductive epoxy or solder material such as InSn, PbSn and etc. It is important that the wire-bonding has not been used, so as to reduce inductances from the wires which correspond to the inductance per unit length of about 1 nH/mm. Thus, RF characteristics are improved. As an alternative, the leads can be substituted by ceramic feed-throughs. In this case, however, the package costs may increase, hence lead 50 is attached to stem 40 by employing a conventional glass seal powder. Here, the glass having low dielectric constant is selected to reduce the parasitic capacitance. A hard glass (BH-7/K) that belongs to the $B_2O_3$—$SiO_2$ series, which has a dielectric ratio of 5.5 (I MHz, 25° C.), and a soft glass (ST-4F/K) that belongs to the $Na_2O$—$BaO$ series, which has a dielectric constant of 6.7, are suggested as representative examples of the glass seal powder employed in the present invention.

Referring now to FIG. 4, laser diode 10 emits laser beam and is disposed at V-groove 101 in SiOB 100.

Photo diode 30 which is disposed in parallel with stem 40 receives back facet light emitted from laser diode 10 and converts it into current for the purpose of laser light monitoring. Photo diode 30 can generate adequate level of monitor photo-current above 100 μA by collecting the reflected light at V-groove 101. In another embodiment, photo diode 30 can be disposed on to SiOB 100 thus located at the other end of V-groove 101.

50 Ω, or alternatively 25 Ω, characteristic impedance lines 104, 105 are composed of a signal line 104 and a ground plane 105. Signal line 104 is connected with a cathode of laser diode 10 by means of wire bonding 107, and a RF matching resistor 103 is disposed within the signal line. Ground plane 105 is directly connected with the anode of laser diode 10 by means of die-bonding and is also electrically connected with the stem 40. Spiral inductor 102 functions as a choke and is connected with laser diode 10 by means of wire bonding 107. Matching resistor 103 and spiral inductor 102 can be monolithically integrated on SiOB 100 through thin-film process to fabricate the laser module package more compactly.

Figure 5:
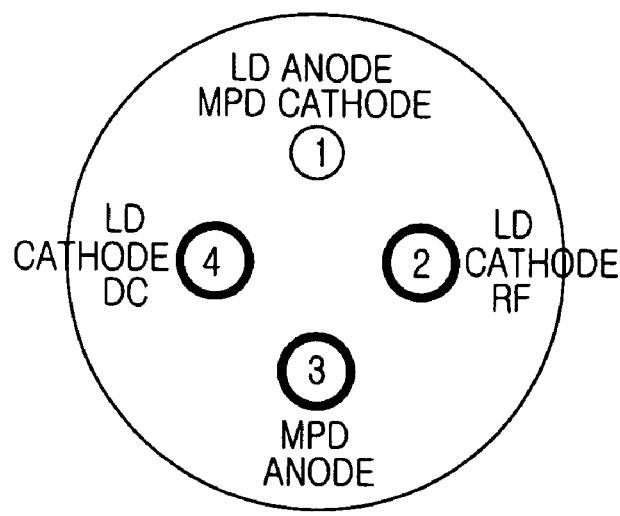
FIG. 5 is a top view showing the arrangement of leads for the TO-can laser module according to a preferred embodiment of the present invention.

As shown in FIG. 5, lead 50 comprises a common lead 1 with which the anode of laser diode 10 and the cathode for photo diode 30 have been connected together, a RF lead 2 for the cathode of laser diode 10, an anode lead 3 for photo diode 30, and a DC lead 4 also for the cathode of laser diode 10.

The heat generation in the matching resistor 103 is originated from the DC current flow in case of conventional high speed TO-can based laser module. This heat generation can be reduced by separating DC lead 4 and RF lead 2 for laser diode 10 thus by employing a bias-tee inside the TO-can structure. Without the internal bias-tee, the junction temperature of the laser diode 10 increases mainly due to the DC current flow across the RF matching resistor, thus the temperature characteristics of the un-cooled optical module are deteriorated fatally, for example, by the reduction of electro-optic conversion efficiency.

Further, the number of leads has been reduced by connecting the anode of laser diode 10 and the cathode of photo diode 30 to a common lead 1. In this instance, Surface Mountable Device (SMD) type inductor 106 can be employed for RF isolation between laser diode 10 and photo diode 30, which prevents RF cross-talk between these two devices. In another embodiment, both the anode of laser diode and the cathode of photo diode 30 can have their own leads separately, without employing the inductor 106 for RF isolation.

Figure 6:
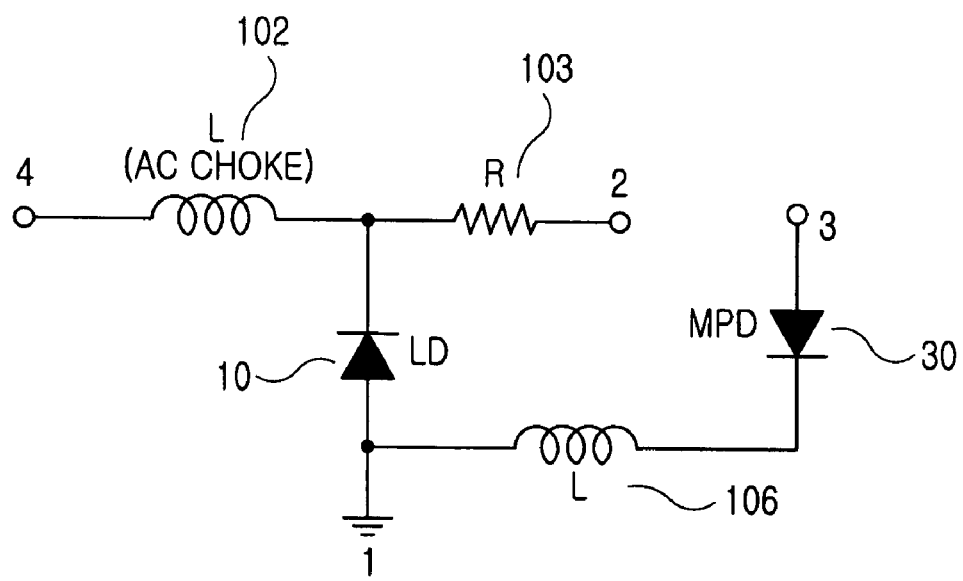
FIG. 6 is a circuit diagram for the TO-can laser module according to a preferred embodiment of the present invention.

According to the structure of the optical module as described above, an equivalent circuit shown in FIG. 6 is constructed. As shown in FIG. 6, inductor 102 connected with lead 4 is an inductor acting as an AC choke formed in spiral shape, and resistor 103 connected with lead 2 is a matching resistor. Also, inductor 106 connected between the cathode of photo diode 30, the anode of which has been connected with lead 3, and laser diode 10, the cathode of which has been connected with lead 1, is made of an SMD inductor. Note that the order of the SMD inductor 106 and the photo diode 30 can be reversed without any significant deterioration of the isolating function.

As described above, according to the optical module of the present invention, RF characteristics are improved by employing an SiOB as sub-mount to make it possible to obtain 10 Gbps operation while maintaining the conventional TO-can structure.

Further, it is possible to achieve adequate level of monitor photo-current by collecting the back face light which is reflected from the V-groove 101.

Also, the heat generated by the DC current flow can be reduced by embedding the bias-tee inside the TO-can structure thereby the temperature rise can be suppressed, which results in the enhancement of electro-optic conversion efficiency.

Additionally, the size of the optical module can be compact and the assembly process can be simplified through the monolithic integration of the matching resistor and the spiral inductor on to SiOB.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An optical module comprising:
   a stem;
   a silicon optical bench disposed on the stem, the silicon optical bench having a V-groove;
   a laser diode disposed over the V-groove;
   a photo diode disposed in the stem, the photo diode converts light received from the laser diode into current and monitors photo-current level using light reflected from the V-groove;
   a plurality of leads coupled to the stem; and an inductor as a choke disposed on the silicon optical bench coupled to the laser diode.

2. The optical module as claimed in claim 1, wherein the inductor is a spiral type thin-film inductor.

3. The optical module as claimed in claim 1, further comprising a RF matching resistor disposed on the silicon optical bench and electrically connected with the laser diode.

4. The optical module as claimed in claim 1, wherein the photo diode is bonded to the silicon optical bench.

5. The optical module as claimed in claim 1, wherein the plurality of leads is bonded to the silicon optical bench using an epoxy or solder.

6. The optical module as claimed in claim 1, wherein the stem and the leads are bonded using glass seal powders having lower dielectric constants than those of ceramic materials.

7. The optical module as claimed in claim 6, wherein the glass seal powders is selected from the group consisting of a hard glass that belongs to the $B_2O_3$—$SiO_2$ series and a soft glass that belongs to the $Na_2O$—$BaO$ series.

8. The optical module as claimed in claim 1, wherein the plurality of leads comprises:
   a first lead electrically connected with an anode of the laser diode;
   a second and the third lead electrically connected with a DC terminal and a RF terminal of the laser diode respectively; and
   a fourth and the fifth lead electrically connected with an anode and a cathode of the photo diode, respectively.

9. The optical module as claimed in claim 8, wherein the first lead and the fifth lead are common.

10. The optical module as claimed in claim 8, further comprising an inductor connected between the cathode of the photo diode and the anode of the laser diode in order to achieve RF isolation.

11. The optical module as claimed in claim 1, further comprising an impedance line.

12. An optical module comprising:
   a stem;
   a silicon optical bench disposed in the stem, the silicon optical bench having a V-groove;
   a laser diode disposed over the V-groove;
   a photo diode disposed on the stem, the photo diode converts light received from the laser diode into current and monitors photo-current level using light reflected from the V-groove;
   a plurality of ceramic feed-throughs coupled to the stem; and
   an inductor as a choke disposed on the silicon optical bench and coupled to the laser diode.

13. The optical module as claimed in claim 12, further comprising an impedance line.

14. The optical module as claimed in claim 12, wherein the inductor is a spiral type thin-film inductor.

15. The optical module as claimed in claim 12, further comprising a RF matching resistor disposed on the silicon optical bench and electrically coupled to the laser diode.

16. The optical module as claimed in claim 12, wherein the photo diode is bonded to the silicon optical bench.

17. The optical module as claimed in claim 12, wherein the plurality of ceramic feed-throughs is bonded to the silicon optical bench using an epoxy or solder.

18. The optical module as claimed in claim 12, wherein the stem and the ceramic feed-throughs are bonded using glass seal powders having lower dielectric constants than those of ceramic materials.

19. The optical module as claimed in claim 18, wherein the glass seal powders is selected from the group consisting of a hard glass that belongs to the $B_2O_3$—$SiO_2$ series and a soft glass that belongs to the $Na_2O$—$BaO$ series.

* * * * *